(12) United States Patent
Sivertsen

(10) Patent No.: US 10,193,710 B2
(45) Date of Patent: *Jan. 29, 2019

(54) SYSTEM FOR TRANSMITTING CONTROL SIGNALS OVER TWISTED PAIR CABLING USING COMMON MODE OF TRANSFORMER

(71) Applicant: ADVOLI LIMITED, Wanchai OT (HK)

(72) Inventor: Clas Gerhard Sivertsen, Lilburn, GA (US)

(73) Assignee: ADVOLI LIMITED, Wan Chai (HK)

( * ) Notice: Subject to any disclaimer, the term of this patent is extended or adjusted under 35 U.S.C. 154(b) by 0 days.

This patent is subject to a terminal disclaimer.

(21) Appl. No.: 15/658,585

(22) Filed: Jul. 25, 2017

(65) Prior Publication Data

US 2017/0324589 A1    Nov. 9, 2017

Related U.S. Application Data

(63) Continuation of application No. 15/016,710, filed on Feb. 5, 2016, now Pat. No. 9,729,357.

(51) Int. Cl.
| | |
|---|---|
| *H04L 25/02* | (2006.01) |
| *H04B 3/56* | (2006.01) |
| *H04N 7/10* | (2006.01) |
| *H03F 3/195* | (2006.01) |

(52) U.S. Cl.
CPC .......... *H04L 25/0276* (2013.01); *H04B 3/56* (2013.01); *H04L 25/0266* (2013.01); *H04L 25/0282* (2013.01); *H03F 3/195* (2013.01); *H04N 7/10* (2013.01); *H04N 7/108* (2013.01); *Y10T 29/4902* (2015.01)

(58) Field of Classification Search
CPC .......... H04N 7/10; H04N 7/108; H03F 3/195; Y10T 29/4902
USPC ....................................................... 375/258
See application file for complete search history.

(56) References Cited

U.S. PATENT DOCUMENTS

| | | | |
|---|---|---|---|
| 5,581,710 A | 12/1996 | Noel, Jr. et al. | |
| 2004/0090335 A1* | 5/2004 | Pfefferseder | G08B 29/188 340/600 |
| 2008/0137759 A1* | 6/2008 | Cai | H04L 25/0266 375/257 |

(Continued)

FOREIGN PATENT DOCUMENTS

CN    202586972 U    12/2012

OTHER PUBLICATIONS

Taiwanese First Office Action dated Jan. 9, 2017 cited in Application No. 105104032, 10 pgs.

*Primary Examiner* — Leila Malek
(74) *Attorney, Agent, or Firm* — Locke Lord LLP; Tim Tingkang Xia, Esq.

(57) ABSTRACT

A method for transmitting control systems over twisted pair cabling. The method includes: receiving a first single-ended transmission signal; converting the first single-ended transmission signal to a first differential transmission signal; transmitting the first differential transmission signal over a first two pairs of wires via a common mode of a transformer; receiving a first differential reception signal over a second two pairs of wires via the common mode of the transformer; and converting the first differential reception signal to a first single-ended reception signal.

20 Claims, 2 Drawing Sheets

(56) References Cited

U.S. PATENT DOCUMENTS

| | | | |
|---|---|---|---|
| 2010/0054345 A1* | 3/2010 | Yamamoto | H04L 12/10 |
| | | | 375/257 |
| 2012/0201544 A1* | 8/2012 | Zhang | H04B 10/25754 |
| | | | 398/115 |
| 2012/0210384 A1 | 8/2012 | Cirstea et al. | |
| 2013/0242760 A1* | 9/2013 | Peyton | H04Q 1/136 |
| | | | 370/250 |

* cited by examiner

SYSTEM FOR TRANSMITTING CONTROL SIGNALS OVER TWISTED PAIR CABLING USING COMMON MODE OF TRANSFORMER

RELATED APPLICATION

This application is a Continuation of co-pending U.S. application Ser. No. 15/016,710 entitled "System for Transmitting Control Signals Over Twisted Pair Cabling Using Common Mode of Transformer" filed Feb. 5, 2016, which is incorporated herein by reference.

BACKGROUND

Ethernet has become a widespread method of transmitting information over local area networks. Ethernet is a common term used to describe the link layer and physical layer standards of communication. At the physical layer, Ethernet often communicates over twisted pair cabling using the various 10-BaseT, 100-BaseT, 1000 BaseT, or 10 GBaseT standards. Ethernet may also be transmitted using the HDBaseT standard and twisted pair cabling. HDBaseT is also able to transmit audio and video signals, as well as power and usb signals over traditional twisted pair cabling, typically Cat5e or Cat6 cabling. However, transmission of control signals traditionally requires an additional cable. This causes problems were one cable breaks and the other remains: for example, the control cable breaks, but the video cable remains. Using multiple types of cables causes problems in installations with multiple channels, where the cable carrying the control signal may be mistakenly associated with the wrong Ethernet cable.

Even where prior art communications systems communicate both video and control signals over the same cable, such systems, such as HDBaseT systems powered by Valens chips, require that both the receiving and the transmitting system be fully up and running. Thus, in a display system using HDBaseT to communicate between a computer and a display, both the display and the computer must be powered on. However, often times the displays are not powered on, so prior art systems do not enable remote turn on or control of the display. Leaving both systems constantly powered on in order to facilitate transmission and reception of control signals is quite power hungry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
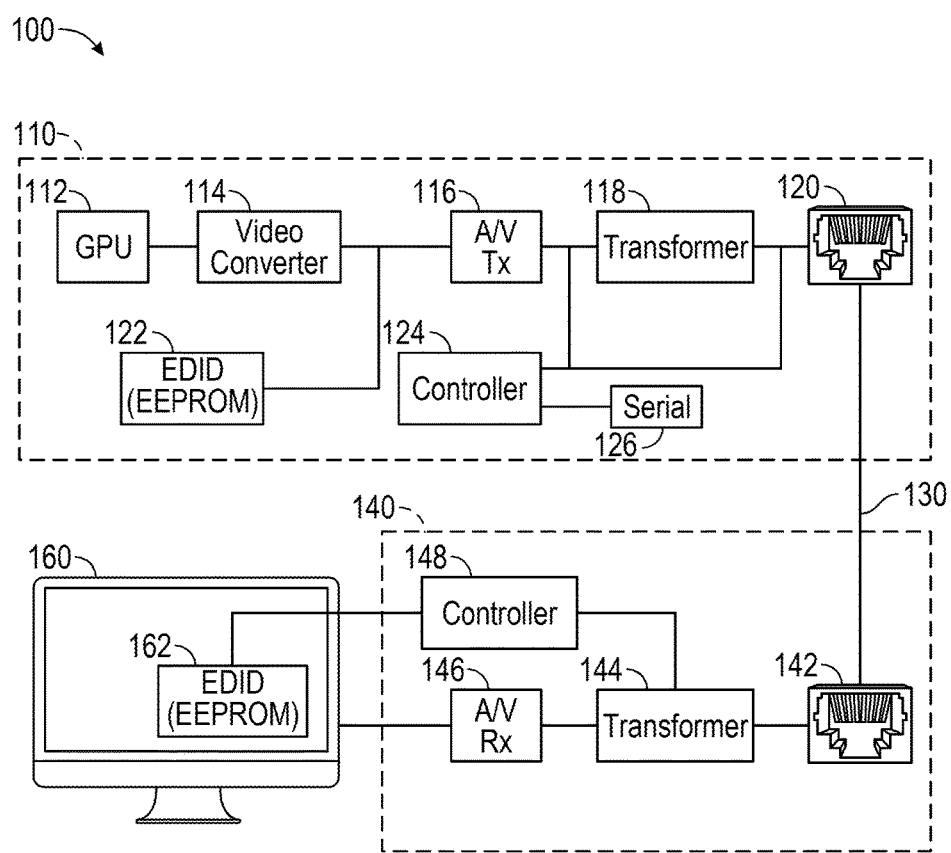
FIG. 1 is a block diagram of an exemplary display system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A method for transmitting control systems over twisted pair cabling is provided. The method includes: receiving a first single-ended transmission signal; converting the first single-ended transmission signal to a first differential transmission signal; transmitting the first differential transmission signal over a first two pairs of wires via a common mode of a transformer; receiving a first differential reception signal over a second two pairs of wires via the common mode of the transformer; and converting the first differential reception signal to a first single-ended reception signal.

This disclosure provides a display system and a method for transmission of control data over twisted pair cabling, for example, cabling used in conjunction with HDBaseT communications. In this detailed description, the term "adapter" refers to either an external display dongle, an internal dongle, a controller card in a display, or a daughter card mounted or connected to a controller card in a display. A graphics card communicates with an adapter in communication with a display. The graphics card is used in conjunction with a computer. The graphics card in conjunction with the adapter provide for control signals to be transmitted by the computer system to a display via the adapter. Using, for example, the Consumer Electronics Control ("CEC") protocol, the host system containing the graphics card may send control signals to a display in communication with the adapter over a side-band signal that does not require the display to be powered on. The control signals are differential signals electrically superimposed on the communications signals (in HDBaseT, Pulse Amplitude Modulation ("PAM") signals), acting as a side-band signal. By using differential signals transmitted across separate pairs, noise and interference effects on the control signal is minimized.

FIG. 1 is a block diagram of an exemplary display system in accordance with some embodiments. As shown in FIG. 1, a display system 100 is provided. The display system 100 includes a graphics card 110, a display 160, and a display adapter 140. The graphics card 110 may be plugged onto a motherboard (not shown) of a PC via, for example, a PCI Express Interface 111. The graphics card 110 may include a graphics processing unit ("GPU") 112, a video converter 114, an audio/video ("A/V") transmitter 116, a transformer 118, an RJ45 connector 120, a memory 122, and a controller 124 connected to a serial port, such as USB port 126. The GPU 112 is connected to the video converter 114, for example, a Display Port to HDMI converter. The GPU 112 provides, for example, video data via Display Port interface to the video converter 114. Display Port is a digital display interface developed by the Video Electronics Standards Association (VESA), and is primarily used to connect a video source to a computer display, though it can also be used to carry audio, USB, and other forms of data.

Alternative embodiments do not include a GPU 112, but rather receive a Display Port signal at the Display Port to HDMI converter 114 or altogether bypass the Display Port to HDMI converter 114 and receive an HDMI signal at transmitter 116.

The output of the video converter 114 is connected to the audio/video transmitter 116 and to an EDID (EEPROM) 122. The video converter 114 receives and outputs video data to audio/video transmitter 116 via HDMI interface. The audio/video transmitter 116 is further connected to the transformer 118 and transmits audio/video signal. Existing technology examples of an audio/video transmitters and receivers are: Valens chipsets utilizing HDBaseT standard and Aptovision BlueRiver chipsets using standard IP based systems. Those skilled in the art after reading this disclosure would appreciate that other chip sets with other standards could be used as the audio video transmitter 116. The audio/video signal may be HDBaseT. HDBaseT is a consumer electronic and commercial connectivity standard for transmission of uncompressed high-definition video, audio, power, home networking, Ethernet, USB, and some control signals, over a common category (ordinary Cat5 may be used, but Cat6e or above provides for longer reach) cable with a standard connector (RJ45). As can be seen, in order to use the Valens or Aptovision system for control signals, all systems must be powered up. HDBaseT can be transmitted over category 6a cables or above up to 100 meter, or even longer, with 8P8C modular connectors of the type commonly used for local area network connections. The transformer 118 is designed and manufactured to comply with the appropriate standard, such as HDBaseT standards.

The video data from the audio/video transmitter 116 is sent to a local area network 130, such as Ethernet, by using the RJ45 connector 120. For example, HDBaseT supports the 100 Mbit/s version of Ethernet over twisted pair known as 100 BASE-T. This can provide Internet access, or enable televisions, stereos, computers and other devices to communicate with each other and access multimedia content, including video, pictures and music stored on the local network.

The controller 124 is connected to the EDID (EEPROM) 122 and both sides of the transformer 118. The controller 124 may be a digital signal processor, a processor, a microprocessor, or a microcomputer on a chip. In certain embodiments, controller 124 and controller 148 are low power microprocessors. The controller 124 transmits and receives control information to and from a controller 148 on the communications adapter 140 through side-band communication. This control information may be transmitted using the CEC standard over novel differential signals superimposed on the PAM communications that occurs over the cabling 130. More detail on this novel electrical circuit is described with respect to FIG. 2 below. The display 160 in communication with adapter 140 need not be powered on for this control communication to occur.

The display adapter 140 includes an RJ45 connector 142, a transformer 144, audio/video receiver 146, and the controller 148. The transformer 144 is designed and manufactured to comply with the appropriate standard, such as the HDBaseT standards. The audio/video receiver 146 receives video data from the audio/video transmitter 116, by using the RJ45 connector 142 and the local area network 130.

The display 160 is connected to the display adapter 140 via HDMI interface. A memory 162 (such as EEPROM) storing an EDID of the display 160 is powered by HDMI interface even if the display is turned off. The controller 148 may be a digital signal processor, a processor, a microprocessor, or a microcomputer on a chip. The controller 148 of the display adapter 140 communicates with controller 124 of graphics card 110 to facilitate the transfer of control signals between the display 162 and the graphics card 110.

As the graphics card controller 124 is in communication with the adapter controller 148, the host computer, via the serial port 126, can effectively issue commands or requests to the display 160. For example, the controllers 124 and 148 may cooperate to issue commands to the display 160 using the CEC protocol. Using CEC, the host computer can issue commands to, for example, turn displays on or off; adjust contrast or brightness; or adjust color. CEC can also be used to query information from the displays, such as the model, serial number, and manufacturing date of the display.

Figure 2:
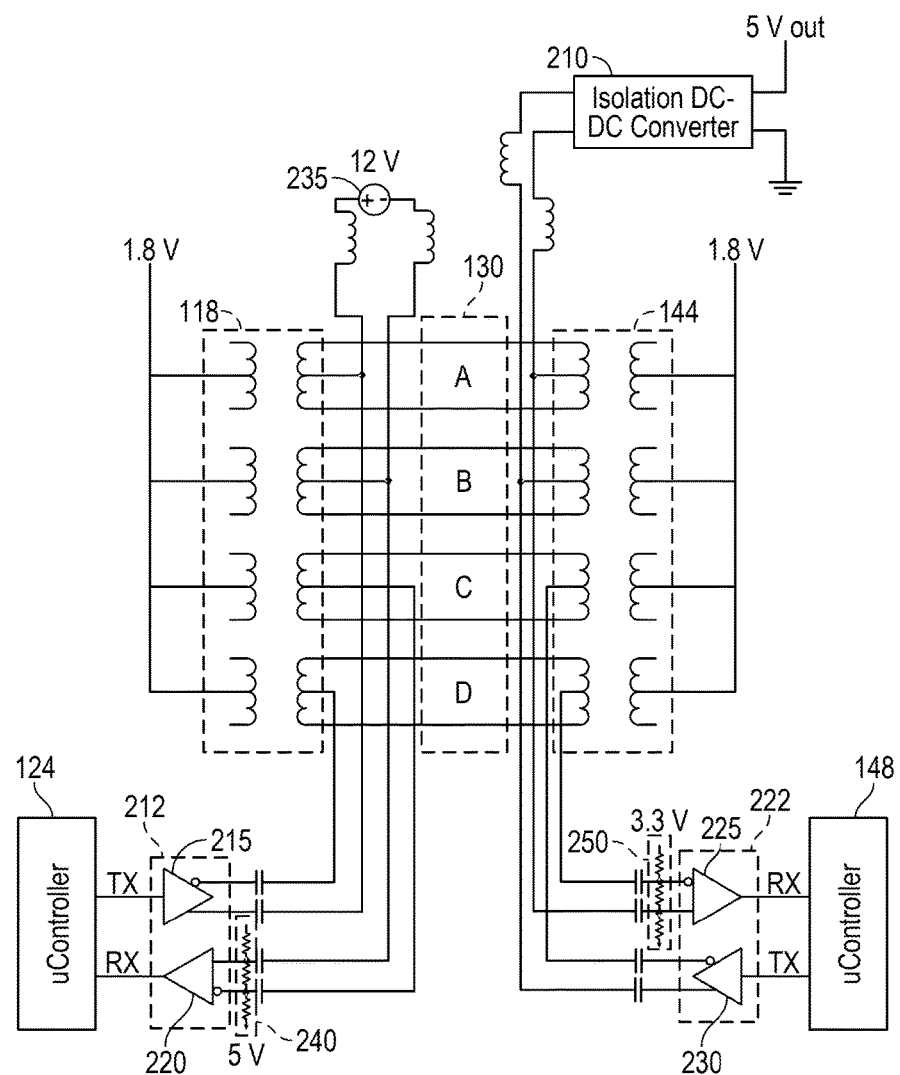
FIG. 2 is an electrical drawing of more detailed of the transmission circuitry in accordance with some embodiments.

FIG. 2 is an electrical drawing in more detail of the transmission circuitry in accordance with some embodiments. This discloses a single channel. Controller 124 communicates using single ended UART ("Universal Asynchronous Receiver/Transmitter") transmitter (TX) and receiver (RX) signals to a UART to RS485 converter 212. The UART to RS485 converter 212 converts, at differential transmitter 215, the TX from single ended UART signal to a differential signal on two wires and converts, at differential receiver 220, incoming RS485 two wire signals to a single UART signal. By using a two wire signal, there is common mode noise rejection. Once the signal has been differentialized, it is placed on the twisted pair cable using the common mode of the transformer 118. In this exemplary figure, the transmit signals are placed on the center taps of coils A and D, respectively. The received signals are received from the center taps of coils B and C, respectively. The outside taps of coils A, B, C, and D contain the communications signals, for example the HDBaseT PAM signals. This is done because the power level and ground at the graphics card 110 may be different from the power level and ground at adapter 140. The transformer 118 and 144 provide galvanic isolation.

Power supply 235 of +12 volts goes into the center tap of coil A and the minus side of power supply goes into the center tap of coil B. Thus, power is transmitted on the common mode of the transformer. Any voltage could of course be used. The power is transmitted across the twisted pair cabling to the display side. At the display side, the power is retrieved from the center taps of the coils and goes to DC to DC isolation converter 210 providing power to whatever needs it at the adapter 140 side. The power supply is tightly held at, for example, 12 volts and varies slightly with the PAM signal that is carried over the twisted pair. Thus, power is injected at, for example, 12 volts by the graphics card 110 and power is extracted by the adapter 140.

The adapter controller 148 has a similar configuration to that described in the previous paragraphs. Adapter controller 148 also communicates using UART single ended transmission (TX) and receiver (RX) UART signals to UART to RS485 converter 222. UART to RS485 converter 222 converts, at differential transmitter 230, the TX from single ended UART signals to a differential signal on two wires and converts, at differential receiver 225, incoming RS485 two wire signals to a single UART signal. By using a two wire signal, there is common mode noise rejection. Once the signal has been differentialized, it is placed on the twisted pair cable using the common mode of transformer 144. In this exemplary figure, the receive signals are received from the center taps of coils A and D, respectively. The transmit signals are transmitted from the center taps of coils B and C, respectively. The outside taps of coils A, B, C, and D contain the communications signals, for example the HDBaseT PAM signals.

Isolation capacitors are used on both sides to isolate the circuits on each side from the other side. Biasing circuits 240 and 250 provide potential on the otherwise floating receiver differential circuit. In one exemplary embodiment, each of the three resistors is 100 kilo ohms.

Thus, the above system uniquely uses the common mode of the transformer in order to communicate side-band control signals from a graphics card to an adapter. These signals are superimposed over the standard communications signals that are placed on the twisted pair cabling. By using sideband communications in conjunction with the power supply system described above, control signals can be transmitted and received, even if the display system is powered off. The power on the primary side of the transformers showing 1.8V maybe be 0V when the system is powered off, but the differential signals on the secondary transformer side will still work the same. Also, the power to the common mode of the secondary side of the transformers showing 12V may be 0V when the system is powered off, but the differential signals superimposed on these signals will continue to operate at a different bias level.

The method disclosed includes: receiving a first single-ended transmission signal; converting the single-ended transmission signal to a first differential transmission signal; transmitting the first differential transmission signal over a first two pairs of wires via a common mode of a transformer; receiving a second differential reception signal over a second two pairs of wires via the common mode of the transformer; and converting the second differential reception signal to a single-ended reception signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a first transformer having four coils, each of the four coils of the first transformer having a respective center tap, wherein the four coils of the first transformer comprises a first set of coils and a second set of coils, the first set of coils of the first transformer are respectively coupled to a first end of first two twisted pairs of wires, and the second set of coils of the first transformer are respectively coupled to a first end of second two twisted pairs of wires;
receiving, by a first differential transmitter, a first single-ended transmission signal, wherein the first differential transmitter is coupled to the center tap of each of the first set of coils of the first transformer respectively;
converting, by the first differential transmitter, the first single-ended transmission signal to a first differential transmission signal;
transmitting the first differential transmission signal from the first differential transmitter over the first twisted two pairs of wires via the first set of coils of the first transformer using a common mode of the first transformer;
receiving, by a first differential receiver, a first differential reception signal over the second twisted two pairs of wires via the second set of coils of the first transformer using the common mode of the first transformer, wherein the first differential receiver is coupled to the center tap of each of the second set of coils of the first transformer respectively; and
converting, by the first differential receiver, the first differential reception signal to a first single-ended reception signal.

2. The method of claim 1, further comprising transmitting power over the common mode of the first transformer via the first twisted two pairs of wires and the second twisted two pairs of wires.

3. The method of claim 1, further comprising:
providing a second transformer coupled to the first transformer and having four coils, each of the four coils of the second transformer having a respective center tap, wherein the four coils of the second transformer comprises a first set of coils and a second set of coils, the first set of coils of the second transformer are respectively coupled to a second end of the first two twisted pairs of wires, and the second set of coils of the second transformer are respectively coupled to a second end of the second two twisted pairs of wires;
receiving, by a second differential receiver, the first differential transmission signal over the first twisted two pairs of wires via the first set of coils of the second transformer, wherein the second differential receiver is coupled to the center tap of each of the first set of coils of the second transformer respectively; and
converting, by the second differential receiver, the first differential transmission signal into a second single ended reception signal.

4. The method of claim 3, further comprising:
receiving, by a second differential transmitter, a second single-ended transmission signal, wherein the second differential transmitter is coupled to the center tap of each of the second set of coils of the second transformer respectively;
converting, by the second differential transmitter, the second single-ended transmission signal into the first differential reception signal; and
transmitting, by the second differential transmitter, the first differential reception signal over the second twisted two pairs of wires via the second set of coils of the second transformer using a common mode of the second transformer.

5. The method of claim 3, further comprising transmitting power over the common mode of the first transformer and receiving the power over the common mode of the second transformer via the first twisted two pairs of wires and the second twisted two pairs of wires.

6. The method of claim 5, further comprising isolating the received power.

7. The method of claim 6, further comprising converting the received power from a first voltage level to a second voltage level.

8. The method of claim 7, wherein the power transmitted is 12 volts.

9. The method of claim 8, wherein the power is converted from 12 volts to about 5 volts.

10. The method of claim 1, wherein the first single-ended transmission signal is generated by a microcontroller.

11. The method of claim 1, wherein the first single-ended reception signal is received by a microcontroller.

12. The method of claim 4, wherein the second single-ended transmission signal is generated by a microcontroller.

13. A method, comprising:
providing a first transformer comprising first, second, third and fourth coils, each of the first, second, third and fourth coils of the first transformer having a respective center tap;

receiving, by a first differential transmitter, a first single-ended transmission signal, wherein the first differential transmitter has a first differential line coupled to the center tap of the first coil of the first transformer and a second differential line coupled to the center tap of the fourth coil of the first transformer;

converting, by the first differential transmitter, the first single-ended transmission signal to a first differential transmission signal;

transmitting, by the first differential transmitter through the first differential line and the second differential line, the first differential transmission signal via the center taps of the first and fourth coils of the first transformer using a common mode of the first transformer;

receiving, by a first differential receiver having a third differential line coupled to the center tap of the second coil of the first transformer and a fourth differential line coupled to the center tap of the third coil of the first transformer, a first differential reception signal through the third differential line and the fourth differential line via the center taps of the second and third coils of the first transformer using the common mode of the first transformer; and converting, by the first differential receiver, the first differential reception signal to a first single-ended reception signal.

14. The method of claim 13, further comprising:

providing a second transformer comprising first, second, third and fourth coils, each of the first, second, third and fourth coils of the second transformer having a respective center tap, wherein the first coil of the second transformer is coupled to the first coil of the first transformer via a first twisted pair of wires, the second coil of the second transformer is coupled to the second coil of the first transformer via a second twisted pair of wires, the third coil of the second transformer is coupled to the third coil of the first transformer via a third twisted pair of wires, and the fourth coil of the second transformer is coupled to the fourth coil of the first transformer via a fourth twisted pair of wires;

receiving, by a second differential transmitter, a second single-ended transmission signal, wherein the second differential transmitter has a fifth differential line coupled to the center tap of the second coil of the second transformer and a sixth differential line coupled to the center tap of the third coil of the second transformer;

converting, by the second differential transmitter, the second single-ended transmission signal into the first differential reception signal; and transmitting, by the second differential transmitter, the first differential reception signal over the second and third twisted pairs of wires via the second and third coils of the second transformer using a common mode of the second transformer.

15. The method of claim 14, further comprising:

receiving, by a second differential receiver, the first differential transmission signal over the first and fourth twisted pairs of wires via the first and fourth coils of the second transformer, wherein the second differential receiver has a seventh differential line coupled to the center tap of the first coil of the second transformer and an eighth differential line coupled to the center tap of the fourth coil of the second transformer; and converting, by the second differential receiver, the first differential transmission signal into a second single ended reception signal.

16. The method of claim 14, further comprising:

transmitting power over the common mode of the first transformer and receiving the power over the common mode of the second transformer via the first and second twisted pairs of wires.

17. The method of claim 16, further comprising isolating the received power.

18. The method of claim 17, further comprising converting the received power from a first voltage level to a second voltage level.

19. The method of claim 18, wherein the power transmitted is 12 volts and is converted to 5 volts.

20. The method of claim 14, wherein the first single-ended transmission signal and the second single-ended transmission signal are respectively generated by a microcontroller, and the first single-ended reception signal is received by the microcontroller.

* * * * *